(12) United States Patent
East

(10) Patent No.: US 7,191,503 B2
(45) Date of Patent: Mar. 20, 2007

(54) METHOD OF MANUFACTURING A PIEZOELECTRIC ACTUATOR

(75) Inventor: W. Joe East, Newport News, VA (US)

(73) Assignee: Par Technologies, LLC, Newport News, VA (US)

( * ) Notice: Subject to any disclaimer, the term of this patent is extended or adjusted under 35 U.S.C. 154(b) by 340 days.

(21) Appl. No.: 10/380,547

(22) PCT Filed: Sep. 14, 2001

(86) PCT No.: PCT/US01/28947

§ 371 (c)(1),
(2), (4) Date: May 28, 2003

(87) PCT Pub. No.: WO02/22358

PCT Pub. Date: Mar. 21, 2002

(65) Prior Publication Data

US 2004/0021398 A1     Feb. 5, 2004

Related U.S. Application Data

(60) Provisional application No. 60/233,248, filed on Sep. 18, 2000.

(51) Int. Cl.
*H04R 17/00* (2006.01)
*H01L 41/08* (2006.01)

(52) U.S. Cl. ............... 29/25.35; 156/275.5; 156/275.7; 156/311; 310/311; 310/340; 310/357; 310/358

(58) Field of Classification Search ............... 29/25.35; 156/275.5, 275.7, 311, 307.1, 325, 327; 310/311, 310/357, 358, 367, 369; 417/413.2; 528/170
See application file for complete search history.

(56) References Cited

U.S. PATENT DOCUMENTS

| | | | |
|---|---|---|---|
| 2,731,419 A | * | 1/1956 | Goodman ............... 252/62.9 R |
| 3,936,342 A | | 2/1976 | Matsubara et al. |
| 3,960,635 A | | 6/1976 | LaRoy et al. ............... 156/286 |
| 4,034,780 A | | 7/1977 | Horvath |

(Continued)

FOREIGN PATENT DOCUMENTS

EP     0 202 836 A1     11/1986

(Continued)

OTHER PUBLICATIONS

International Preliminary Examination Report mailed Oct. 3, 2002 in corresponding PCT Application PCT/US01/28947.

(Continued)

*Primary Examiner*—A. Dexter Tugbang
(74) *Attorney, Agent, or Firm*—Nixon & Vanderhye P.C.

(57) ABSTRACT

A method for making a piezoelectric actuator comprises coating at least one of a first surface and a second surface of a piezoelectric element with a polyimide adhesive. The piezoelectric element is then heated to dry the adhesive. Afterwards, the piezoelectric element is inserted between a first metallic layer and a second metallic layer to form an assembly. The assembly is placed in a press. While the assembly is in the press, the polyimide adhesive is cured at a curing temperature which does not depole the piezoelectric element, thereby bonding the piezoelectric element between the first metallic layer and the second metallic layer.

20 Claims, 4 Drawing Sheets

U.S. PATENT DOCUMENTS

| | | | |
|---|---|---|---|
| 4,095,615 A | 6/1978 | Ramsauer | |
| 4,431,937 A * | 2/1984 | White | 310/344 |
| 4,859,530 A | 8/1989 | Roark et al. | |
| 4,939,405 A | 7/1990 | Okuyama et al. | |
| 5,049,421 A | 9/1991 | Kosh | |
| 5,084,345 A | 1/1992 | Manos | |
| 5,156,710 A * | 10/1992 | Chen et al. | 156/273.3 |
| 5,271,724 A | 12/1993 | van Lintel | |
| 5,338,164 A | 8/1994 | Sutton et al. | |
| 5,471,721 A | 12/1995 | Haertling | |
| 5,589,725 A | 12/1996 | Haertling | 310/328 |
| 5,632,841 A | 5/1997 | Hellbaum et al. | |
| 5,759,015 A | 6/1998 | van Lintel et al. | |
| 5,816,780 A | 10/1998 | Bishop et al. | 417/322 |
| 5,849,125 A * | 12/1998 | Clark | 156/222 |
| 5,854,380 A * | 12/1998 | Seto et al. | 528/353 |
| 5,876,187 A | 3/1999 | Afromowitz et al. | |
| 5,909,905 A | 6/1999 | Simpson | |
| 5,945,768 A | 8/1999 | Treu, Jr. | |
| 6,030,480 A | 2/2000 | Face, Jr. et al. | 156/160 |
| 6,033,191 A | 3/2000 | Kamper et al. | |
| 6,042,345 A | 3/2000 | Bishop et al. | |
| 6,052,300 A | 4/2000 | Bishop et al. | 363/131 |
| 6,060,811 A | 5/2000 | Fox et al. | |
| 6,071,087 A | 6/2000 | Jalink, Jr. et al. | |
| 6,071,088 A | 6/2000 | Bishop et al. | |
| 6,104,127 A | 8/2000 | Kameyama et al. | |
| 6,109,889 A | 8/2000 | Zengerle et al. | |
| 6,114,797 A | 9/2000 | Bishop et al. | 310/318 |
| 6,124,678 A | 9/2000 | Bishop et al. | 315/209 |
| 6,156,145 A | 12/2000 | Clark | 156/160 |
| 6,162,313 A | 12/2000 | Bansemir et al. | |
| 6,179,584 B1 | 1/2001 | Howitz et al. | |
| 6,213,735 B1 | 4/2001 | Henco et al. | |
| 6,227,809 B1 | 5/2001 | Forster et al. | |
| 6,227,824 B1 | 5/2001 | Stehr | |
| 6,257,293 B1 | 7/2001 | Face, Jr. et al. | 156/351 |
| 6,379,809 B1 | 4/2002 | Simpson | |
| 6,512,323 B2 | 1/2003 | Forck et al. | |
| 6,734,603 B2 | 5/2004 | Hellbaum et al. | 310/330 |
| 7,070,674 B2 | 7/2006 | Kelley | 156/307 |

FOREIGN PATENT DOCUMENTS

| | | | | |
|---|---|---|---|---|
| GB | 2 013 311 A | 8/1979 | | |
| GB | 2 161 902 A | 1/1986 | | |
| GB | 2 250 911 A | 6/1992 | | |
| GB | 2 262 972 A | 7/1993 | | |
| JP | 59-2385 | * | 1/1984 | 310/311 |
| JP | 2-276280 | * | 11/1990 | 310/311 |
| WO | 87/07218 | 12/1987 | | |

OTHER PUBLICATIONS

International Search Report mailed Jan. 24, 2002 in corresponding PCT Application No. PCT/US01/28947.

GB Examination Report mailed Jun. 4, 2004 in corresponding GB application No. GB0308623.8.

GB Examination Report mailed Nov. 9, 2004 in corresponding GB application No. GB0423682.4.

* cited by examiner

METHOD OF MANUFACTURING A PIEZOELECTRIC ACTUATOR

This application is a national stage of international application PCT/US01/28947 filed 14 Sep. 2001 which designates the U.S., and which claims the benefit and priority of U.S. Provisional Application 60/233,248, filed Sep.18, 2000, all of which are incorporated herein by reference in their entirety.

TECHNICAL FIELD

The present invention is in the field of the manufacture of ferroelectric actuators and miniature diaphragm pumps using these actuators as the prime mover. In the best mode the actuators are piezoelectric.

BACKGROUND ART

The prior art for this invention may be grouped as follows:
I. U.S. Pat. Nos. 5,471,721, 5,632,841, 5,849,125, 6,162,313, 6,042,345, 6,060,811, and 6,071,087 showing either prestressing of piezoelectric actuators, or dome-shaped piezoelectric actuators, or both. This prior art is generally in apposite because the present invention does not use a prestressed or dome-shaped piezoelectric actuator.
II. U.S. Pat. Nos. 6,179,584, 6,213,735, 5,271,724, 5,759,015, 5,876,187, 6,227,809 showing so-called micropumps. Such pumps generally pump only a drop of fluid at a time; because of the small forces and low Reynolds numbers involved, this prior art is generally in apposite.
III. U.S. Pat. Nos. 4,034,780, 4,095,615 showing flapper valves. These are flappers mounted on a separate hinge. No prior art was found showing a flex valve with a miniature pump.
IV. U.S. Pat. Nos. 5,084,345, 4,859,530, 3,936,342, 5,049,421 showing use of polyimide adhesives for various purposes, including bonding metals and other materials to film.
V. U.S. Pat. Nos. 4,939,405, 5,945,768 showing electrical driver circuits for piezoelectric actuators.
VI. U.S. Pat. Nos. 6,227,824, 6,033,191, 6,109,889, German WO 87/07218 showing various kinds of pumps incorporating piezoelectric actuators.

DISCLOSURE OF INVENTION

This invention is a method for making a high-displacement ferroelectric actuator, in this case a piezoelectric actuator. This piezoelectric actuator may then be used as the diaphragm in a small diaphragm pump. The pump is small, lightweight, quiet, and efficient. The best mode, a round pump about 40 mm [1.5"] in diameter by about 13 mm [0.5"] thick and weighing approximately 35 g [one ounce], can pump upwards of 450 milliliters of water or other fluids per minute. These pumping rates are accomplished using a six-volt battery at 25 ma driving through a small electronic driver circuit, approximately 25 mm [1"] square. This circuit forms part of the invention. The one way valve[s] necessary for operation of the invention are flex valves in which a thin film of polyimide acts as the working element.

BEST MODE FOR CARRYING OUT THE INVENTION

Figure 1:
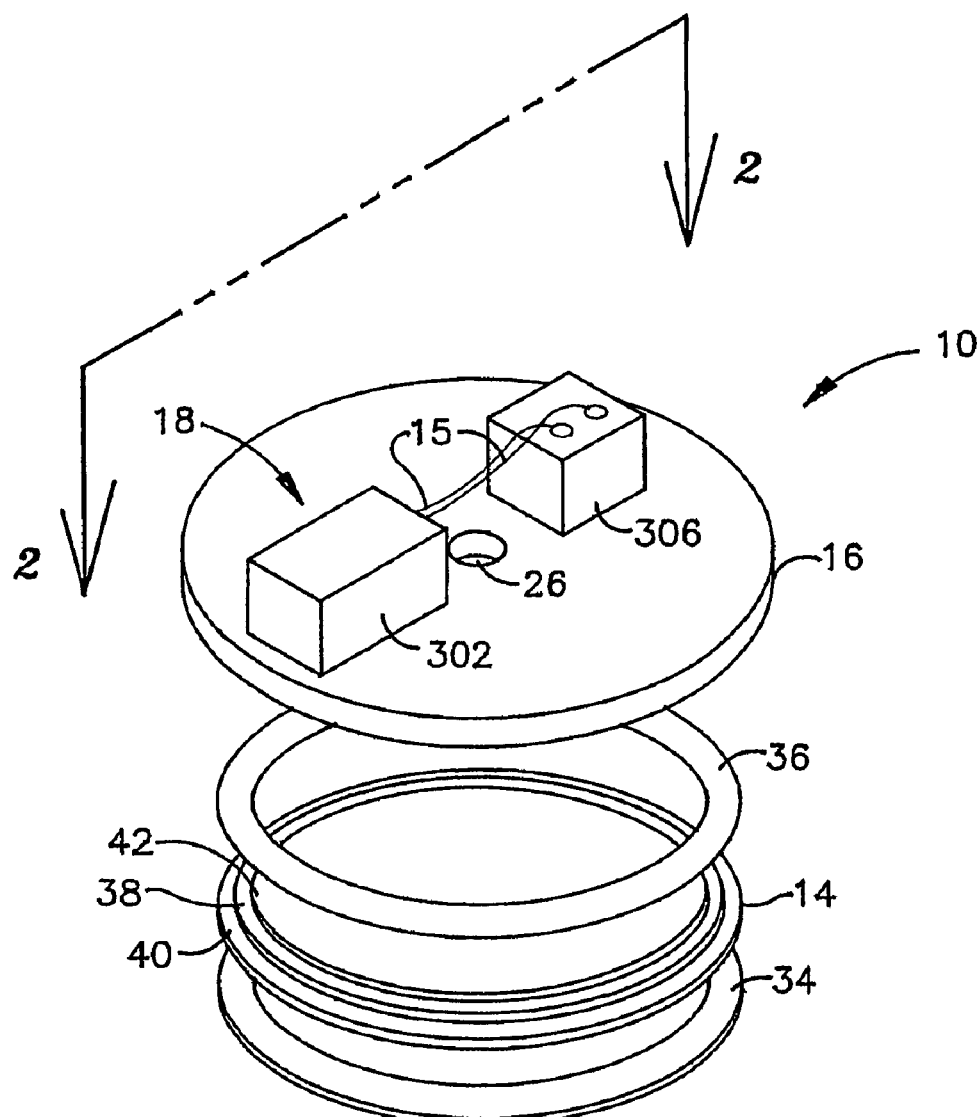
FIG. 1 is a perspective view of the pump of the invention with the parts in the positions they would be for the best mode.

FIG. 1 shows how the piezoelectric actuator of the present invention may be used in a miniature diaphragm pump. The pump 10 is generally in the form of a circular short cylinder. It includes the pump body 12, piezoelectric actuator 14, pump cover 16 and piezoelectric actuator electronic driver circuit 18. The pump body 12 has lugs 20 for mounting the pump to any substrate. Inlet 22 and outlet 24 are part of the pump body 12 though they could be separate pieces otherwise fastened to the pump body. The pump cover 16 is essentially the same diameter and of the same material as the pump body 12. The material would ordinarily be of a standard plastic such as acetal [DELRIN®], PVC, or PC, or of a metal such as stainless steel or brass. These are preferable since they can be easily machined or thermally formed. The cover 16 may be fastened to the pump body 12 by any means such as by a fast-curing adhesive while the pump body 12 and cover 16 are under compression such as by clamping. The pump cover has an opening 26 for venting the space above the actuator 14.

Figure 2:
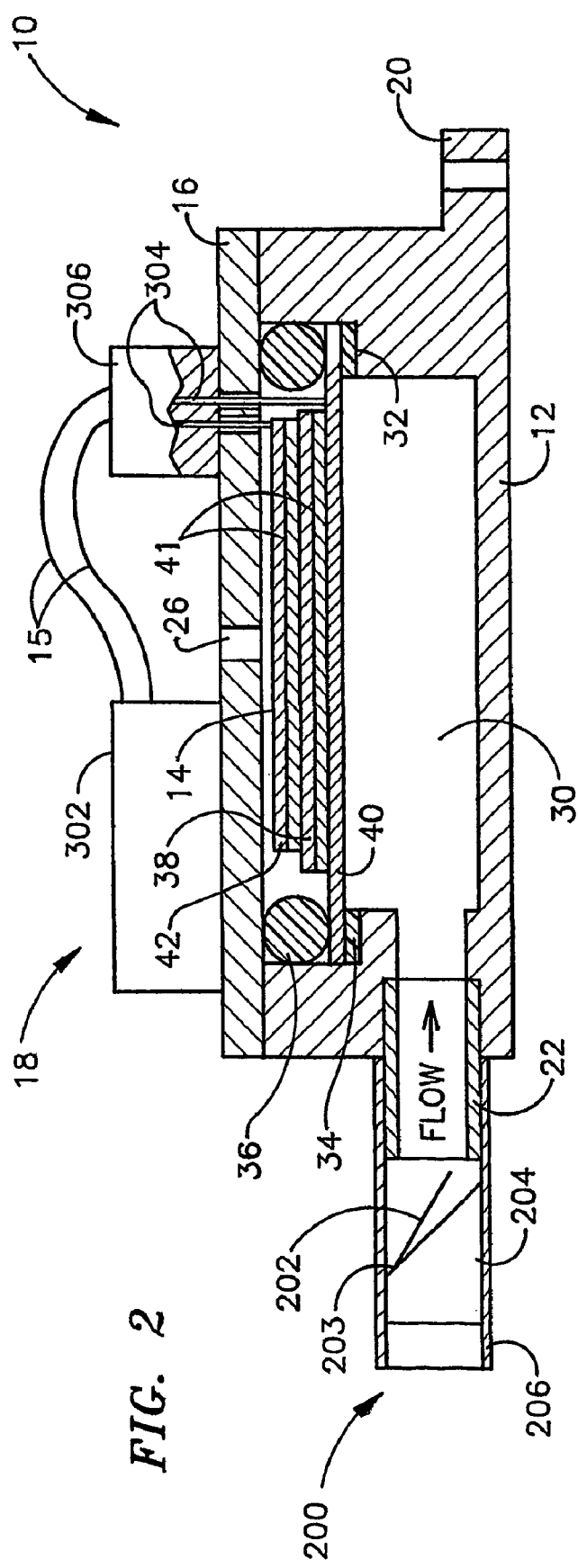
FIG. 2 is a sectional view of the pump along line 2—2 of FIG. 1.

The dimensions of the pump depend on the particular application. In the best mode the pump body 12 is about 40 mm [1.5"] in diameter. A pump chamber 30 is formed in the center of the pump body 12, for example by molding or machining. The pump chamber 30 is about 28 mm [1.125"] in diameter or about 3 mm [⅛"] less in diameter than the diameter of the piezoelectric actuator 14. The chamber 30 is about 6 mm [0.25"] deep. A seat 32 about 3 mm [0.125"] wide and about 2 mm [0.070"] deep is provided in the pump body 12 at the top of the pump chamber 30. As shown in FIG. 2 the piezoelectric actuator 14 is mounted on the seat 32 to form the diaphragm in the top of the pump chamber 30.

To assemble the pump a sealing washer 34 the same diameter as the piezoelectric actuator is put on the seat 32 to seal the pump chamber when the piezoelectric actuator 14 is put in place. The sealing washer 34 may be of a relatively soft material such as Buna-N or silicon rubber to account for any irregularities in the mating surfaces and ensure a good seal between the actuator 14 and the pump body 12. Once the piezoelectric actuator 14 is in place an o-ring seal 36 is placed on top of the piezoelectric actuator 14 to hold the piezoelectric actuator 14 in place and seal it from the cover 16. The cover 16 of the same outside diameter as the pump body 12 base but only about ⅛" thick is then put in place. Sealing washer 34 and o-ring seal 36 are referred to collectively as the pump seals, even though they both have the additional function of fixing the actuator 14 in place with respect to the pump body 12. The cover 16 is then fastened to the body 12 while under compression, for example by adhesive under clamping pressure, to seal the piezoelectric actuator 14 to the body 12 and fix the actuator 14 in place to allow pumping action.

The process for making the piezoelectric actuator 14 generally is as follows:

A piezoelectric wafer 38 formed of a polycrystalline ferroelectric material such as PZT5A available from Morgan Electro Ceramics is obtained. As the name implies this material is actually a ceramic. It is processed into the high displacement piezoelectric actuator 14 by laminating the piezoelectric wafer 38 between a metal substrate layer 40 and an outer metal layer 42 as shown in FIG. 2., where the thicknesses of the three layers and the adhesive between them are exaggerated for clarity. The bonding agent 41 between the layers 38 and 40 is a polyimide adhesive. This lamination process does several things: It ruggedizes the piezoelectric actuator 14 because the metal layers keep the piezoelectric from fracturing during high displacement. It permits higher voltage due to the relatively low dielectric constant of the polyimide adhesive, thereby allowing 3–5 times higher displacement than a conventional piezoelectric. Being laminated between metal layers using a high performance polyimide adhesive makes the piezoelectric actuator highly resistant to shock and vibrations. With this invention piezoelectric actuator devices can be used in environments as hot as a continuous 200° C., compared to only 115° C. for a conventional piezoelectric. The significant increase in temperature is due to the polyimide adhesive used in the bonding process which is unaffected by temperatures up to 200° C. Epoxy adhesives used in conventional piezoelectrics normally can withstand temperatures up to only 115° C. This increase in operating temperature would allow the pumps of this invention to be used in a variety of pump applications, even pumping boiling water continuously.

The piezoelectric wafers 38 are available from the vendor mentioned in various shapes and thicknesses. For the invention circular wafers 25 mm [1"] in diameter and 0.2 mm [0.008"] thick were found to be optimum. Square wafers were tried but did not give maximum displacement. In general the thinner the wafer, the greater the displacement at a given voltage, but the lower the force. The 0.2 mm [8-mil] thickness gives the best flow rate for the diameter of the wafer.

In the best mode stainless steel 0.1 mm [0.004"] thick is used for the substrate layer 40, the layer in contact with the pumped liquid. Stainless steel is chosen for its compatibility with many liquids, including water, its fatigue resistance, its electrical conductivity and its ready availability at low cost. Aluminum 0.05 mm [0.001"] thick is used for the outer layer 42 primarily for its electrical conductivity in transmitting the actuating voltage to the piezoelectric wafer 38 across its surface, but also for its robustness and ready availability at low cost.

The diameter of the piezoelectric wafer 38 being about 25 mm [1"] as noted above, the diameter of the substrate layer 40 is about 40 mm [1.25"]. The setback of the wafer 38 from the edge of the substrate layer 40 is an important feature of the invention. This leaves a rim that serves as a clamping surface for the actuator assembly. This means that the entire piezoelectric wafer 38 is free and relatively unconstrained, except insofar as it is bonded to the substrate 40 and the outer layer 42. This allows maximum displacement of the actuator 14, ensuring maximum flow of liquid through the pump.

The diameter of the outer layer 42 is smaller than the diameter of the wafer 38. This setback of the outer layer 42 from the edge of the wafer 38 is done to prevent arcing over of the driving voltage from the outer layer 42 to the substrate layer 40.

Other materials and thicknesses may be used for the enclosing layers 40 and 42 as long as they meet the requirements noted.

Of special note is that the piezoelectric actuator of the invention is flat. In much of the prior art the actuator is dome-shaped, it being supposed that this shape is necessary for maximum displacement of the actuator and therefore maximum capacity of the pump for a given size actuator. Special molds and methods are proliferated to produce the shapes of the actuator considered necessary, or to produce a prestress in the actuator that is supposed to increase its displacement. Our tests of the invention have shown, however, that a dome shape is not necessary, and that the flat actuator has a higher pumping capacity for a given size than any known pump in the prior art. As such the actuator is much simpler to produce in large quantities, as the following will demonstrate. The flat shape also means that the pump may be smaller for a given application. A flat actuator is also inherently easier to mount in any given application than a dome shaped actuator would be. Furthermore, pumps using the actuator have been shown to have sufficiently long life for numerous applications. Many manufacturers whose names are household words are using or testing this invention.

Figure 3:
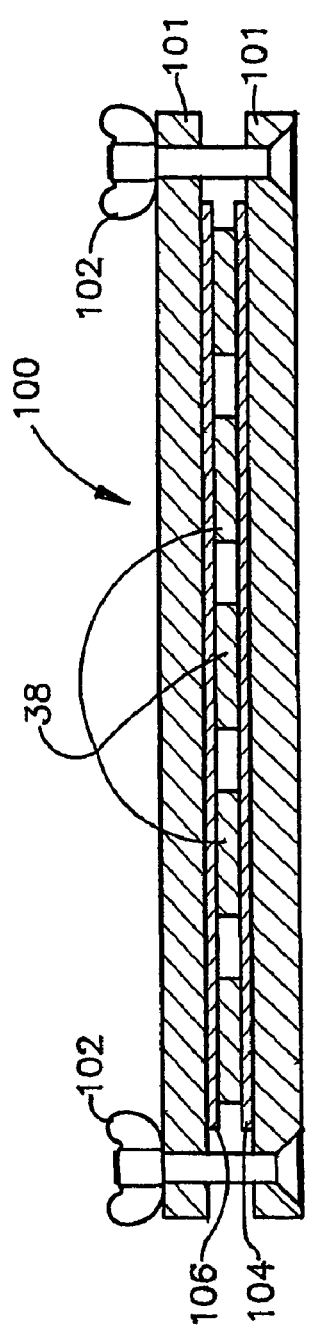
FIG. 3 is a sectional view of the press used to make the piezoelectric actuators of the invention.

The process for making the piezoelectric actuator 14 specifically is as follows:

1. The piezoelectric wafer 38 and and enclosing layers 40 and 42 are cleaned using a solvent that does not leave a residue, such as ethanol or acetone. All oil, grease, dust and fingerprints must be removed to ensure a good bond.
2. The piezoelectric wafer 38 is then coated on both sides with a thin layer 41, not more than 0.1 mm [0.005"], of a high performance polyimide gel adhesive such as that available from Ranbar Inc. The gel should contain a minimum of 25% solids to allow sufficient material for a good bond after the solvent is driven off
3. The piezoelectric wafer 38 is then placed under a standard heat lamp for about 5 minutes to remove most of the solvent from the gel and start the polyimide gel polymerization process. Both sides of the piezoelectric must be cured under the heat lamp since both sides are to be bonded to metal.
4. Once the adhesive is dry to the touch, the piezoelectric wafer 38 is then placed between the substrate layer 40 and the outer layer 42.
5. The assembly is placed in a special press. This press was developed specifically for making piezoelectric actuators 14 and provides uniform temperature and pressure to ensure a good bond between the three components of the actuator. Referring to the best mode shown in FIG. 3 the press comprises two 300 mm [12"] square by 6 mm [¼"] thick plates of aluminum 101 held together with thumbscrews 102, four on each edge. To ensure uniform pressure while in the press, the bottom plate 101 of the press is covered with a sheet of low cost polyimide film 104 such as Upilex available from Ube Industries Ltd. The piezoelectric actuators 38 are placed on the film and a sheet of high temperature, 4 mm [⅛"] thick rubber 106 is placed over the piezoelectric actuators. The rubber on top and the film on bottom cushion the piezoelectric actuators 38 providing even distribution of pressure when the press is taken to temperature. Of course other dimensions of the press plates are possible.
6. Once the piezoelectric actuators are placed in the press the thumbscrews 102 are made finger tight.
7. The press is then placed in a standard convection oven for thirty minutes at about 200° C.

8. The press is removed from the oven, allowed to cool to a safe temperature, and the actuators 14 removed from the press.

The press 100 is the result of an effort to develop a low cost, rapid process for manufacturing piezoelectric actuators. The press takes advantage of the thermal expansion of the aluminum plates 101 which creates the necessary pressure to cause the polyimide adhesive to bond to the piezoelectric wafer 38 and metal layers 40, 42 while it is at curing temperature. The press can be put into the oven, and taken out, while the oven is at temperature thereby allowing continuous operation during the manufacturing process. The abrupt change in temperature does not affect the piezoelectric actuators 14 since they will remain under pressure even while the press is removed from the oven and allowed to assume room temperature.

Of special note is that this press process is one of further driving off the solvent and curing the polyimide at a relatively low temperature. Prior art processes for making similar piezoelectric actuators require the mold/press to be taken to much higher temperatures, high enough to melt the polyimide adhesive. Furthermore, since such high temperatures depole the piezoelectric ceramic, it is necessary to pole it again at the end of the process. The present invention eliminates this step altogether, thus contributing to the lower cost of manufacturing the piezoelectric actuators.

Using these simple methods and hardware it is possible to manufacture hundreds of thousands of piezoelectric actuators 14 per month, or even more, depending on the scale of the operation desired.

The principle of the piezoelectric actuator pump 10 is the same as for any diaphragm pump. Normally the diaphragm in a diaphragm pump is operated by a cam or a pushrod connected to a motor or engine. This is not the case in the piezoelectric actuator pump 10. The piezoelectric actuator 14 acts as the diaphragm and moves when a pulsed electric field is imposed across the piezoelectric wafer 38 by means of the enclosing layers 40 and 42. This varying electric field causes the piezoelectric actuator 14 to expand and contract. As the actuator 14 expands, with its edge constrained, it assumes a slight dome shape as the center of the actuator moves away from the pump chamber 30. This draws liquid into the pump chamber 30 through the inlet 22. When the piezoelectric actuator 14 contracts it moves toward the liquid, forcing it out of the pump chamber 30 through outlet 24.

One of the problems with prior art piezoelectric actuators has been the voltage necessary to drive the piezoelectric. To provide power to the piezoelectric actuator pump 10 the electrical driver 18 shown in FIG. 4 was invented that converts the voltage from any six volt d.c. power source to an alternating current of over 200 volts peak-to-peak. This voltage is sufficient in the preferred embodiment to drive a piezoelectric actuator to attain the pumping rates noted above. In the circuit in FIG. 4 point A is connected to the substrate layer 40 while point B is connected to the outer layer 42.

Figure 4:
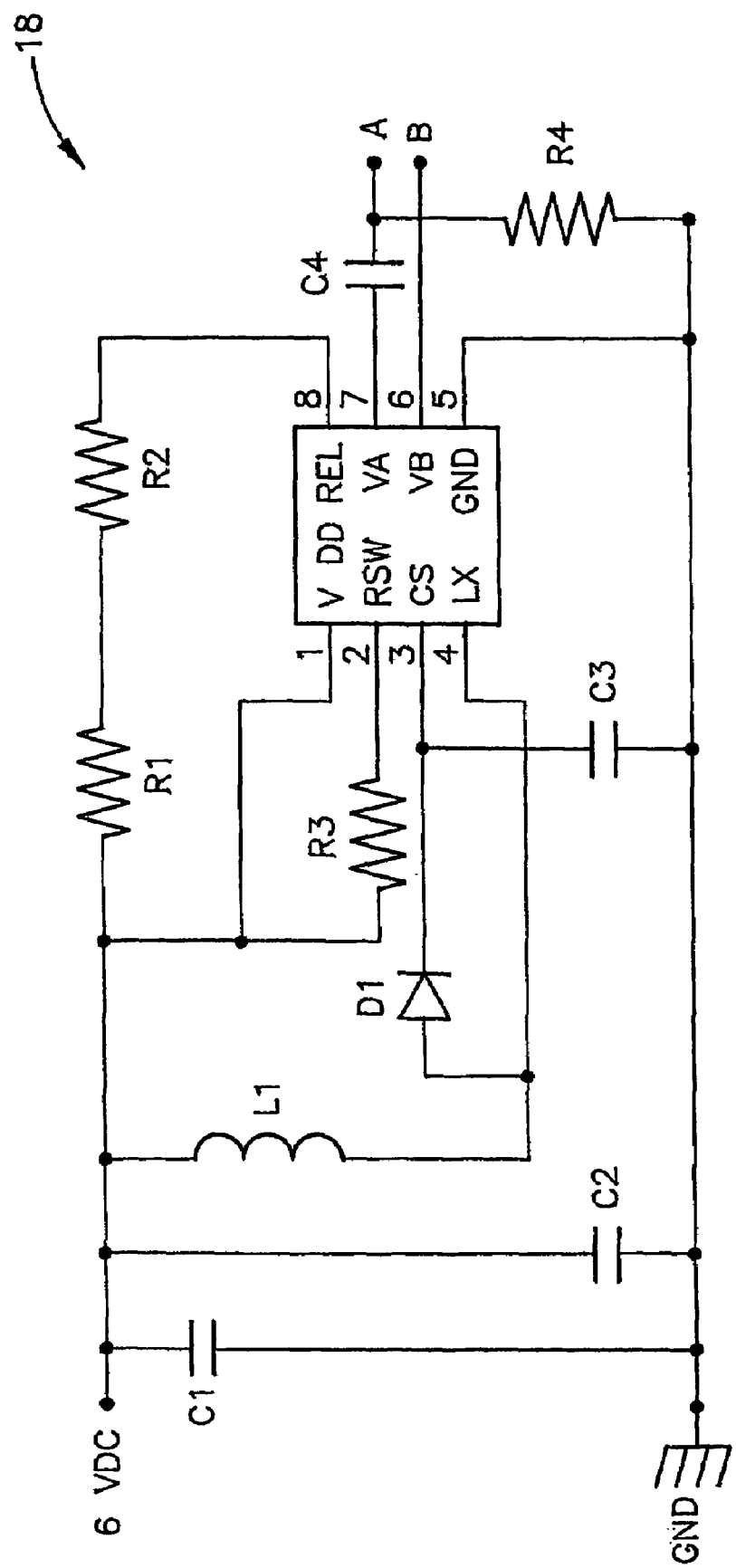
FIG. 4 shows the driver circuit for the piezoelectric actuator used with the pump.

Piezoelectric actuators perform better when the peak-to-peak voltage is not evenly balanced. They respond better to a positive voltage than the same negative voltage. Thus the circuit 18 has been designed to produce alternating current with the voltage offset to 150 volts positive and 50 volts negative. This is sufficient voltage for the piezoelectric actuator to make a very efficient pump. While a sinusoidal wave will work, at the lower frequencies and voltages, a square wave makes the piezoelectric more efficient. Values of the circuit components in FIG. 4 are as follows:

| | |
|---|---|
| R1 | 8 to 20 MΩ |
| R2 | 8 to 20 MΩ |
| R3 | 680 KΩ |
| R4 | 1 MΩ |
| C1 | 0.1 μF |
| C2 | 0.1 μF |
| C3 | 0.1 μF[200 v] |
| C4 | 0.47 μF[200] |
| L1 | 680 μH |
| D1 | BAS21 diode |

U1 is an IMP 528 chip designated an electroluminescent lamp driver. In this circuit, with the other components, it serves to shape the pulses and amplify them to the 200 volt peak-to-peak value needed to drive the piezoelectric actuator 14. The values of R1 and R2 are chosen to vary the frequency of the output between about 35 Hz and about 85 Hz, depending on the particular application.

This circuit is composed of miniaturized components so it may be contained in a box 302 approximately 25 mm [1"] square by 6 mm [¼"] deep. It has only eleven off-the-shelf surface mount components. The box 302 may be mounted anywhere in proximity to the pump 10. In the best mode it is mounted on top of the pump, as shown in FIGS. 1 and 2, for example by an appropriate adhesive. Leads 15 run from the driver circuit 18 and are fastened to spring loaded contacts 304 such as those sold by the ECT Company under the trademark POGO®. These contacts 304 are mounted in a box 306 on top of pump cover 16 and project through the pump cover 16 to make contact with the two layers 40 and 42. This small driver circuit eliminates the need for the large power supplies and transformers used in prior art piezoelectric applications. Alternatively the leads 15 could be run through an opening in the cover 16 and fastened electrically to the layers 40 and 42, as by soldering. O-ring 36 is soft enough to accommodate the soldered point on the substrate layer 42.

Several conventional types of one-way valves were evaluated as inlet and outlet valves for the piezoelectric actuator pump 10. All had various drawbacks including bulk and poor response to the dynamic behavior of the piezoelectric actuator 14. An inline flex valve 200 was invented that is well adapted to the action of the piezoelectric actuator 14 as shown in FIG. 2. The working element of the flex valve is an elliptical disk 202 of polyimide film about 0.05 mm [0.002"] thick. The disk 202 is the same size and shape as the end of a short piece of rigid tube 204 formed at about a 45° angle to the axis of the rigid tube 204. The inside diameter of the rigid tube 204 is the same as the inside diameter of the inlet 22 or outlet 24 of the pump body 12. Rigid tube 204 is captured in the end of the flexible system conduit 206 which slips over the inlet/outlet 22,24 and carries the system liquid, as shown in FIG. 2. Valve disk 202 is attached to the nether end of the slanted surface at the point designated 203 by any sufficient means such as by adhesive or thermal bonding. A similar flex valve 200 may be placed in the outlet 24. Both disks 202 of both valves would point in the same direction downstream. However, it was found in operating the pump 10 that it would pump at full capacity with no valve at all in the outlet. It is postulated that the liquid in the inlet circuit, even with the inlet valve partially open, provides enough inertia to act as a closed inlet valve. Operation with only the inlet valve is considered to be the best mode.

This flex valve 200 is an important feature of the invention. It is of absolute minimum bulk. The mass of the disk 202 is also about as light as it could possibly be so it reacts rapidly to the action of the actuator 14. When it is open it presents virtually no resistance to the system flow. Mounted at the 45° angle, it has to move through an angle of only 45° to fully open, whereas if it were mounted perpendicular to the flow it would have to move through an angle twice as large. It is of extreme simplicity and low cost of materials and fabrication. Also no part of the valve 200 projects into pump chamber 30. This minimizes the volume of pump chamber 30 which helps make the pump self-priming and increases its efficiency. Further contributing to these characteristics is that the flex valve 200 is biased closed when the pump is not operating.

Figure 5:
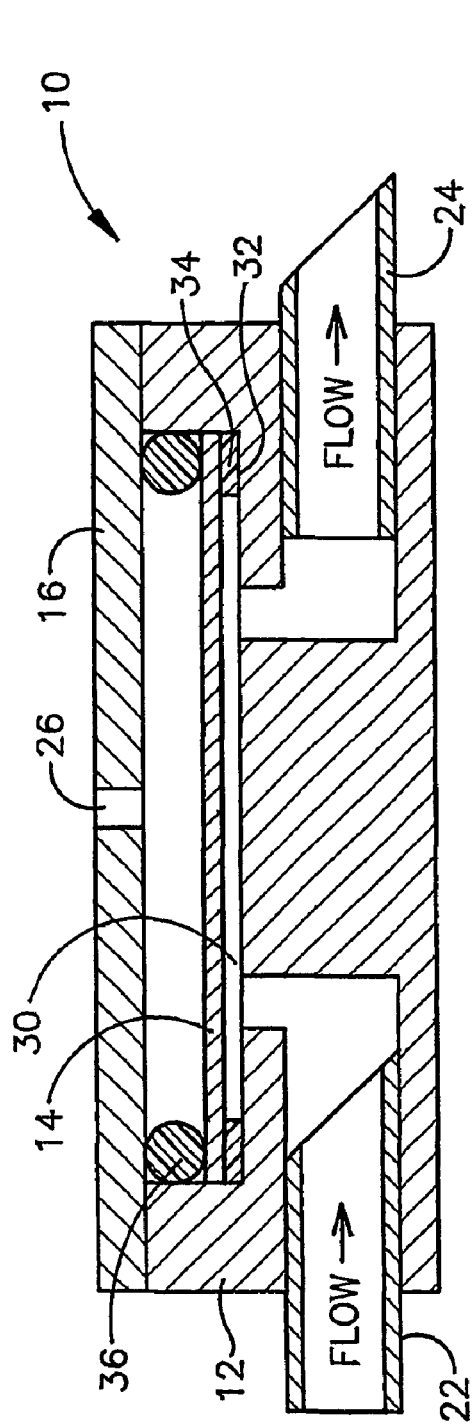
FIG. 5 is a partially diagrammatic view showing an alternative embodiment of the invention in which the pump chamber is reduced in size.
Figure 6:
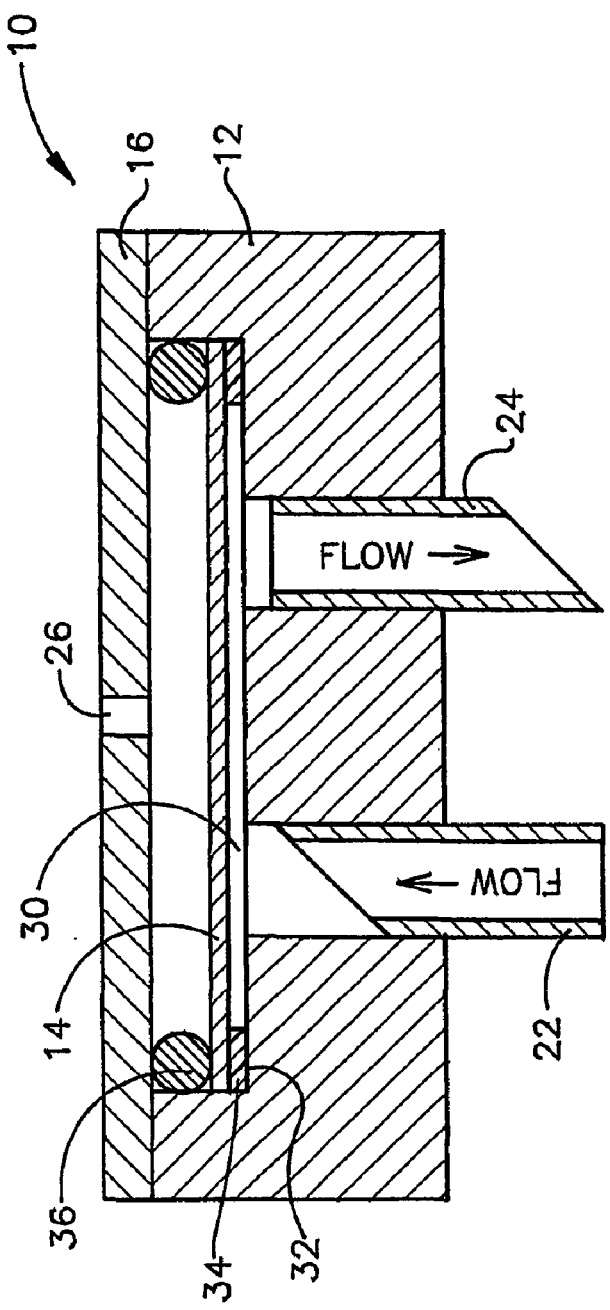
FIG. 6 is a partially diagrammatic view showing another alternative embodiment of a pump in which the inlet and outlet are perpendicular to the plane of the actuator.

FIGS. 5 and 6 show alternative embodiments of the pump of the invention. The pump in FIG. 5 is essentially the same as that of FIG. 2 except that the pump chamber 30 is reduced in thickness to that of the sealing washer 34. This improves the self-priming ability of the pump. The pump in FIG. 6 also has a minimally thick pump chamber 30. Further, the inlet 22 and outlet 24 are perpendicular to the plane of the actuator 14, a configuration that may be more convenient in some applications.

In yet another embodiment, not shown, the bottom of the pump body comprises a piezoelectric actuator 14 arranged identically but as a mirror image of the piezoelectric actuator 14 just described, with the substrate layers 40 facing each other across the pump chamber 30.

In still another embodiment, not shown, two of the pumps above described are mounted side by side in one pump body. The actuator; seals; inlets and outlets, with one-way valve in the inlets only; pump covers; and drivers are positioned in one or more of the configurations described above. In a preferred form of this embodiment, the drivers are in series electrically, with the pumps operating in parallel fluidwise in the system in which they are deployed.

INDUSTRIAL APPLICABILITY

This invention has particular application for water cooling of the CPU in computers but may have wider applications wherever a very small pump of relatively high flow rate and minimum power consumption is needed to move liquids at very low cost. The piezoelectric actuator by itself can have very many other applications, such as speakers, audible alarms, automotive sensors, sound generators for active noise cancellation, and accelerometers.

The invention claimed is:

1. A method for making a piezoelectric actuator comprising:
   (1) coating at least one of a first surface and a second surface of a piezoelectric element with a polyimide adhesive;
   (2) heating the piezoelectric element to dry the adhesive; then
   (3) inserting the piezoelectric element between a first metallic layer and a second metallic layer to form an assembly;
   (4) placing the assembly in a press;
   (5) while the assembly is in the press, curing the polyimide adhesive at a curing temperature which does not depole the piezoelectric element, thereby bonding the piezoelectric element between the first metallic layer and the second metallic layer.

2. The method of claim 1, wherein step (1) comprises coating the piezoelectric with a thin layer of polyimide adhesive no more than 0.005 inch thick.

3. The method of claim 1, further comprising, as act (2) using heat to initiate a polymerization process.

4. The method of claim 1, wherein the polyimide adhesive is a polyimide gel adhesive, and further comprising, as act (2) using heat to remove solvent from the polyimide gel adhesive.

5. The method of claim 1, further comprising performing act (3) only after the polyimide adhesive is dry to the touch.

6. The method of claim 1, further comprising, at least during act (5), applying uniform pressure to the piezoelectric actuator formed by bonding the piezoelectric element between the first metallic layer and the second metallic layer.

7. The method of claim 6, wherein the act of applying pressure comprises:
   (a) laying a polyimide film on a bottom plate of a press;
   (b) placing the piezoelectric actuator on the polyimide film;
   (c) covering the piezoelectric actuator with a sheet of rubber;
   (d) tightening the press whereby the bottom plate and a top plate of the press apply uniform pressure to the piezoelectric situated therebetween.

8. The method of claim 6, further comprising:
   (e) cooling the piezoelectric actuator in the press;
   (f) removing the piezoelectric actuator from the press.

9. The method of claim 1, wherein act (5) comprises inserting the assembly in the press, and then placing the press in a heater.

10. The method of claim 1, further comprising using a polycrystalline material as the piezoelectric element.

11. The method of claim 1, further comprising using stainless steel as the first metallic layer.

12. The method of claim 1, further comprising using aluminum as the second metallic layer.

13. The method of claim 1, further comprising forming the first metallic layer with a rim arranged to serve as a clamping surface.

14. The method of claim 13, further comprising forming the first metallic layer to have a larger surface area than the piezoelectric element.

15. The method of claim 14, further comprising forming the second metallic layer to have a smaller surface area than the piezoelectric element.

16. The method of claim 1, further comprising:
   forming the first metallic layer to have a larger diameter than the piezoelectric element; and
   forming the second metallic layer to have a smaller diameter than the piezoelectric element.

17. The method of claim 1, further comprising using a flat element as the piezoelectric element.

18. The method of claim 1, further comprising using as the polyimide adhesive as a gel which has a minimum of 25% solids.

19. The method of claim 1, wherein the curing temperature does not melt the polyimide adhesive.

20. The method of claim 1, wherein the curing temperature is no more than 200 degrees Centigrade.

* * * * *